(12) United States Patent
Sanjeevarao et al.

(10) Patent No.: US 9,396,780 B1
(45) Date of Patent: Jul. 19, 2016

(54) DECODER

(71) Applicant: FREESCALE SEMICONDUCTOR, INC., Austin, TX (US)

(72) Inventors: Padmaraj Sanjeevarao, Austin, TX (US); David W. Chrudimsky, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/860,874

(22) Filed: Sep. 22, 2015

(51) Int. Cl.
*G11C 8/08* (2006.01)
*G11C 8/10* (2006.01)

(52) U.S. Cl.
CPC ... *G11C 8/10* (2013.01); *G11C 8/08* (2013.01)

(58) Field of Classification Search
CPC .......................................................... G11C 8/08
USPC .................................................... 365/230.06
See application file for complete search history.

(56) References Cited

U.S. PATENT DOCUMENTS

| | | | |
|---|---|---|---|
| 5,867,445 A | 2/1999 | Kirsch et al. | |
| 6,188,634 B1 | 2/2001 | Le | |
| 2002/0097630 A1* | 7/2002 | Aritomi | G11C 8/10 365/230.03 |
| 2010/0020629 A1* | 1/2010 | Chan | G11C 8/08 365/230.06 |

* cited by examiner

*Primary Examiner* — Son Mai

(57) ABSTRACT

A memory system has a decoder circuit that includes a first driver circuit having an input coupled to receive a first pre-decode signal. The first driver circuit includes transistors wherein a first current electrode of a first transistor is coupled to receive a second pre-decode signal. The decoder circuit includes a second driver circuit having an input coupled to receive a third pre-decode signal. The second driver circuit includes transistors wherein a first current electrode of a third transistor in the stack is coupled to receive the second pre-decode signal. A fifth transistor has a first current electrode coupled to an output of the first driver circuit, a second current electrode coupled to an output of the second driver circuit, and a control electrode coupled to a fourth pre-decode signal.

20 Claims, 2 Drawing Sheets

DECODER

BACKGROUND

1. Field

This disclosure relates generally to decoders, and more particularly to digital decoders.

2. Related Art

Decoding is a standard operation in the use of digital information. Accordingly, decoders may be replicated many times in a given integrated circuit. The space required for an individual decoder may be comparatively small, but the decoder may be replicated many times to the point where the space is significant. Decoders are very commonly used in memories and accordingly, it is particularly beneficial if the decoder is usable in a memory.

Accordingly there is a need to reduce the size of individual decoders in an integrated circuit.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
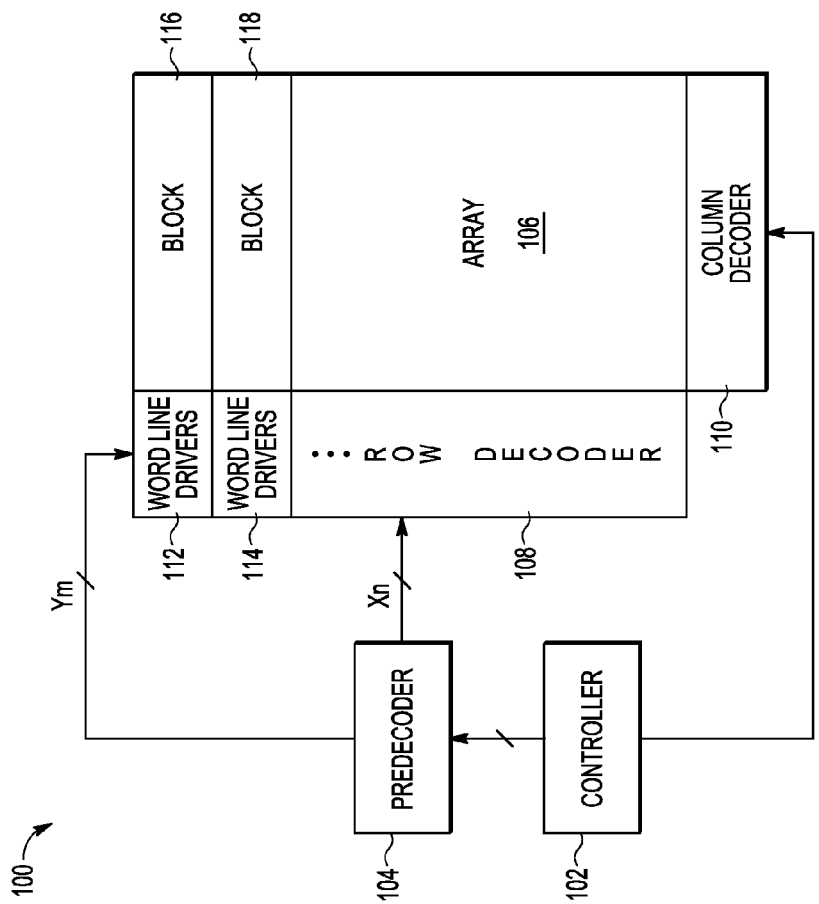
FIG. 1 is a block diagram of a memory system including a memory array.

In one aspect a decoder utilizes nodes that are typically used for power supply terminals for receiving a portion of the signal to be decoded to enable a reduction in the size of the decoder. The decoder is also used as a word line driver. This is better understood by reference to the drawing and the following description.

Shown in FIG. 1 is a memory system 100 that includes a controller 102, a predecoder 104, an array 106 made up of blocks such as blocks 116 and 118, a row decoder 108 that is coupled to array 106 and has word line drivers such as 112 and 114, and a column decoder 110. Controller 102 is coupled to predecoder 104 and column decoder 110. Predecoder 104 is coupled to row decoder 108.

In operation, controller 102 controls the selection of locations in array 106 through predecoder 104 and column decoder 110. Predecoder 104 responds to a row address by providing pre-decode signals Ym and Xn to row decoder 108. The Xn signals run in the word line direction and the Ym signals run in the bit line direction through row decoder 108. A word line driver is selected and the selected word line driver in turn selects one of the word lines in the block to which the word line driver is selected. Column decoder selects the bit line or bit lines with the result that the memory cell or memory cells along the driven word line are accessed through the selected bit line or bit lines. As an example, in the case of block 116 being selected and having four word lines, word line driver 112 would then select which one of the four word lines to enable.

Figure 2:
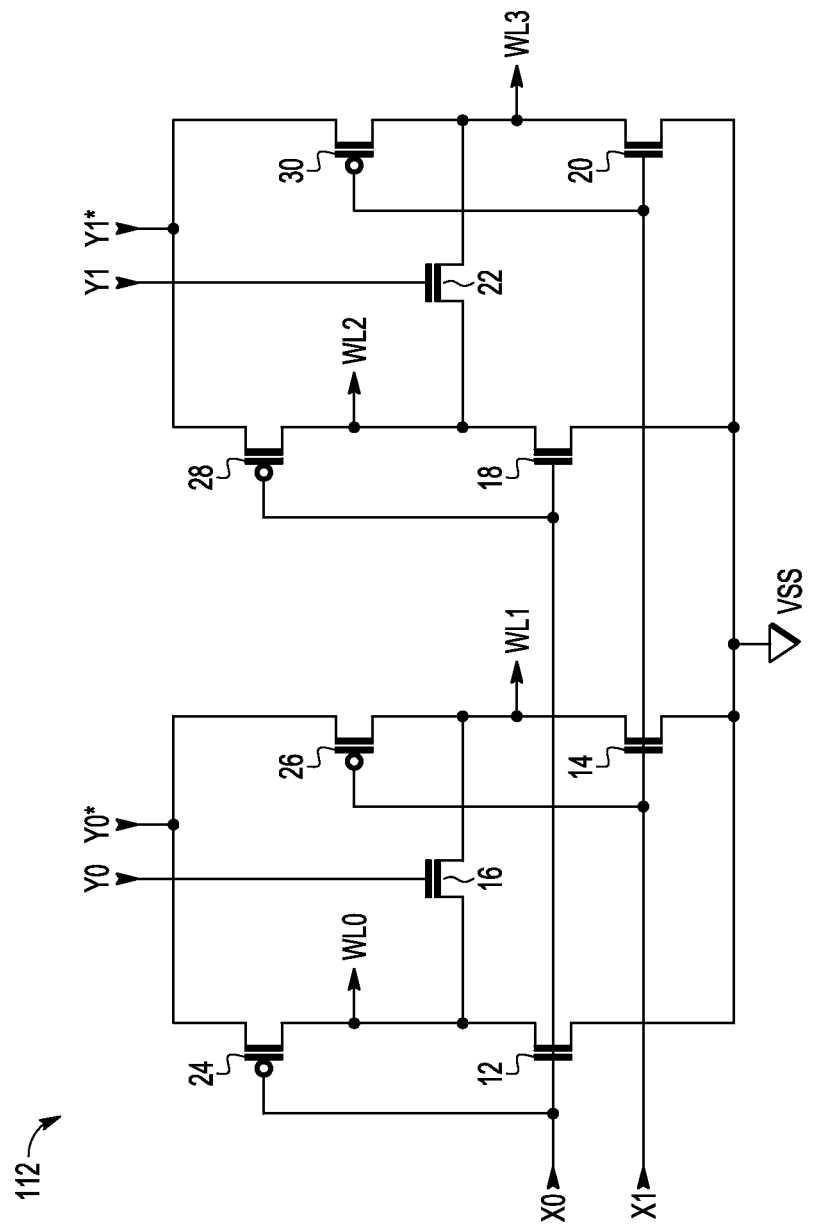
FIG. 2 is a circuit diagram of a combined decoder and word line driver that is one of a plurality of combined decoders and word line drivers that are coupled to the memory array.

Shown in FIG. 2 is word line driver 112 shown as having six N channel transistors 12, 14, 16, 18, 20, and 22 and 4 P channel transistors 24, 26, 28, and 30. Transistor 12 has a first current electrode coupled to a negative power supply terminal VSS, which may be ground, a control electrode for receiving a pre-decode signal X0 which is one of signals Xn, and a second current electrode. The terminal VSS may be selectively decoupled from ground or other power supply terminal, such as in a power down mode. Transistor 24 has a control electrode connected to the control electrode of transistor 12, a first current electrode for receiving a complementary pre-decode signal Y0* which is one of pre-decode signals Ym, and a second current electrode connected to the second current electrode of transistor 12. The second current electrodes of transistors 12 and 24 are also connected to a word line WL0. Transistor 14 has a first current electrode coupled to terminal VSS, a control electrode for receiving a pre-decode signal X1 which is another one of signals Xn, and a second current electrode. Transistor 26 has a control electrode connected to the control electrode of transistor 14, a first current electrode for receiving complementary pre-decode signal Y0*, and a second current electrode connected to the second current electrode of transistor 14. The second current electrodes of transistors 14 and 26 are also connected to a word line WL1. Transistor 16 has a first current electrode connected to the second current electrodes of transistors 12 and 24, a second current electrode connected to the second current electrodes of transistors 14 and 26, and a control electrode for receiving a pre-decode signal Y0 which is one of pre-decode signals Ym. In FIG. 2, transistors coupled in series such as transistor pairs 12 and 24, 14 and 26, 18 and 28, and 20 and 30 may each be considered a stack. Each pair functions as a driver circuit and input to the driver circuit is the gates of the transistor pairs. For example driver circuit 12,24 has an input at the gates of transistors 12 and 14 which receive pre-decode signal X0. The pairs may also be referenced as series connected transistors.

Transistor 18 has a first current electrode coupled to terminal VSS, a control electrode for receiving input signal X0, and a second current electrode. Transistor 28 has a control electrode connected to the control electrode of transistor 18, a first current electrode for receiving complementary pre-decode signal Y1*, and a second current electrode connected to the second current electrode of transistor 18. The second current electrodes of transistors 18 and 28 are also connected to a word line WL2. Transistor 20 has a first current electrode coupled to terminal VSS, a control electrode for receiving pre-decode signal X1, and a second current electrode. Transistor 30 has a control electrode connected to the control electrode of transistor 20, a first current electrode for receiving complementary pre-decode signal Y1*, and a second current electrode connected to the second current electrode of transistor 20. The second current electrodes of transistors 20 and 30 are also connected to a word line WL3. Transistor 22 has a first current electrode connected to the second current electrodes of transistors 18 and 28, a second current electrode connected to the second current electrodes of transistors 20 and 30, and a control electrode for receiving a pre-decode signal Y1.

In typical read and write operations, pre-decode signals Y0, X0, X1, and Y1 are active low so that only one of pre-decode signals X0 and X1 could be a logic low at a given point in time and only one of pre-decode signals Y0 and Y1 could be a logic low at a given point in time. This type of operation may be referenced as one-hot, and the circuit that generates the signals may be referenced as a one-hot decoder. For the case of pre-decode signal X0 being a logic low and thus pre-decode signal X1 being a logic high, transistors 12 and 18 are nonconductive and transistors 14 and 20 are conductive. With transistors 14 and 20 being conductive, word lines WL1 and WL3 are at a logic low and deselected. For the case of pre-decode signal Y0 being a logic low and thus pre-decode signal Y1 being a logic high, transistor 16 is non-conductive and transistor 22 is conductive. Complementary pre-decode signal Y0*, being the complement to pre-decode signal Y0, is a logic high so that a logic high is coupled through transistor 24 to word line WL0. Complementary pre-decode signal Y1*, being the complement of pre-decode signal Y1, is a logic low. Transistor 22, being conductive, ensures that word line WL2 is at a logic low. For the case of pre-decode signal Y1 being a logic low and thus pre-decode signal Y0 being a logic high, transistor 22 is non-conductive and transistor 16 is conductive. Complementary pre-decode signal Y1*, being the complement to pre-decode signal Y1, is a logic high so that a logic high is coupled through transistor 28 to word line WL2. Complementary pre-decode signal Y0*, being the complement of pre-decode signal Y0, is a logic low. Transistor 16, being conductive, ensures that word line WL0 is at a logic low. Thus pre-decode signals X0 and Y0 at a logic low result in a word line WL0 receiving a logic high while word lines WL1, WL2, and WL3 are held at a logic low. If pre-decode signals X0 and Y1 are a logic low, then the result is that a logic high is present on word line WL2 and word lines WL0, WL1, and WL3 are held at a logic low.

For the case of pre-decode signal X1 being a logic low and thus pre-decode signal X0 being a logic high, transistors 14 and 20 are non-conductive and transistors 12 and 18 are conductive. With transistors 12 and 18 being conductive, word lines WL0 and WL2 are at a logic low and deselected. For the case of pre-decode signal Y0 being a logic low and thus pre-decode signal Y1 being a logic high, transistor 16 is non-conductive and transistor 22 is conductive. Complementary pre-decode signal Y0*, being the complement to pre-decode signal Y0, is a logic high so that a logic high is coupled through transistor 26 to word line WL1. Complementary pre-decode signal Y1*, being the complement of pre-decode signal Y1, is a logic low. Transistor 22, being conductive, ensures that word line WL3 is at a logic low. For the case of pre-decode signal Y1 being a logic low and thus pre-decode signal Y0 being a logic high, transistor 22 is non-conductive and transistor 16 is conductive. Complementary pre-decode signal Y1*, being the complement to pre-decode signal Y1, is a logic high so that a logic high is coupled through transistor 30 to word line WL3. Complementary pre-decode signal Y0*, being the complement of pre-decode signal Y0, is a logic low. Transistor 16, being conductive, ensures that word line WL1 is at a logic low. Thus pre-decode signals X1 and Y0 at a logic low result in a word line WL1 receiving a logic high while word lines WL0, WL2, and WL3 are held at a logic low. If pre-decode signals X1 and Y1 are a logic low, then the result is a logic high being present on word line WL3 and word lines WL0, WL1, and WL2 are held at a logic low.

If both pre-decode signals Y0 and Y1 are a logic high, then transistors 16 and 22 are conductive and complementary pre-decode signals Y0* and Y1* are a logic low which is sufficient to place word lines WL0, WL1, WL2, and WL3 in a logic low condition even if one of predecode signals X0 or X1 is a logic low. Taking the case of predecode signal X0 being the predecode signal that is a logic low and thus predecode signal X1 is a logic high. With predecode signal X1 at a logic high, transistors 14 and 20 are conductive which place word lines WL1 and WL3 in the logic low state. With transistors 16 and 22 conductive, these logic lows on word lines WL1 and WL3 are coupled to word lines WL0 and WL2.

If both pre-decode signals X0 and X1 are a logic high, then transistors 12, 14, 18, and 20 are conductive which have the effect of coupling a logic low to word lines WL0, WL1, WL2, and WL3. Pre-decode signals X0 and X1 at a logic high also result in transistors 24, 26, 28, and 30 being non-conductive so that current is blocked and word lines WL0, WL1, WL2, and WL3 can easily be maintained at a logic low regardless of the logic states of pre-decode signals Y0 and Y1 and complementary pre-decode signals Y0* and Y01.

Thus it is seen that an effective decoding scheme is achievable using a reduced number of transistors compared to that typically required. Further, there may be applications where more than one word line be selected such as for a stress test or, in the case of a non-volatile memory, a bulk erase or bulk program. In such cases, both pre-decode lines X0 and X1 may be a logic low and also both pre-decode lines Y0 and Y1 may be a logic low.

By now it should be appreciated that in some embodiments, there has been provided a memory comprising a decoder circuit having a first driver circuit having an input coupled to receive a first pre-decode signal and an output, the first driver circuit including a stack of transistors wherein a first current electrode of a first transistor in the stack is coupled to receive a second pre-decode signal and a first current electrode of a second transistor in the stack is coupled to a first supply terminal. The decoder circuit further includes a second driver circuit having an input coupled to receive a third pre-decode signal and an output, the second driver circuit including a stack of transistors wherein a first current electrode of a third transistor in the stack is coupled to receive the second pre-decode signal and a first current electrode of a fourth transistor in the stack is coupled to the first supply terminal. The decoder circuit further includes a fifth transistor having a first current electrode coupled to the output of the first driver circuit, a second current electrode coupled to the output of the second driver circuit, and a control electrode coupled to a fourth pre-decode signal. The decoder circuit may have a further characterization by which the fourth pre-decode signal is a complement of the second pre-decode signal. The decoder circuit may have a further characterization by which the third pre-decode signal is a complement of the first pre-decode signal. The decoder circuit may have a further characterization by which the output of the first driver circuit is coupled to drive a first word line and the output of the second driver circuit is coupled to drive a second word line. The decoder circuit may have a further characterization by which the decoder circuit is disabled when the first pre-decode signal and the third pre-decode signal are both asserted. The decoder circuit may have a further characterization by which a second current electrode of the first transistor is coupled to a second current electrode of the second transistor and to the output of the first driver circuit, a control electrode of the first transistor is coupled to a control electrode of the second transistor and to the input of the first driver circuit, a second current electrode of the third transistor is coupled to a second current electrode of the fourth transistor and to the output of the second driver circuit, and a control electrode of the third transistor is coupled to a control electrode of the fourth transistor and to the input of the second driver circuit. The decoder circuit may have a further characterization by which the fifth transistor operatively couples a signal from the output of the first driver circuit to the output of the second driver circuit or from the output of the second driver circuit to the output of the first driver circuit. The decoder circuit may have a further characterization by which the first transistor and the third transistor are characterized as P-channel transistors, and the second transistor and the fourth transistor are characterized as N-channel transistors. The decoder circuit may have a further characterization by which the fifth transistor is characterized as an N-channel transistor. The decoder circuit may further include a first plurality of conductive paths to transfer the first and third pre-decode signals to the inputs of the first and second driver circuits, the first plurality arranged to run substantially parallel to the first and second word lines and a second plurality of conductive paths to transfer the second pre-decode signal to the first current electrodes of the first and third transistors and to transfer the fourth pre-decode signal to the control electrode of the fifth transistor, the second plurality arranged substantially orthogonal to the first plurality. The decoder circuit may further include a third driver circuit having an input coupled to receive the first pre-decode signal and an output, the third driver circuit including a stack of transistors wherein a first current electrode of a sixth transistor in the stack is coupled to receive a fifth pre-decode signal and a first current electrode of a seventh transistor in the stack is coupled to the first supply terminal, a fourth driver circuit having an input coupled to receive the third pre-decode signal and an output, the fourth driver circuit including a stack of transistors wherein a first current electrode of a eighth transistor in the stack is coupled to receive the fifth pre-decode signal and a first current electrode of a ninth transistor in the stack is coupled to the first supply terminal, and a tenth transistor having a first current electrode coupled to the output of the third driver circuit, a second current electrode coupled to the output of the fourth driver circuit, and a control electrode coupled to a sixth pre-decode signal.

Also disclosed is a decoder circuit having a first driver circuit including a first plurality of series connected transistors wherein a first current electrode of a first transistor is coupled to receive a first pre-decode signal, a second current electrode of the first transistor is coupled to a first current electrode of a second transistor and to an output of the first driver circuit, a second current electrode of the second transistor is coupled to a first supply terminal, and a control electrode of the first transistor and a control electrode of the second transistor are coupled to a second pre-decode signal. The decoder further includes a second driver circuit including a second plurality of series connected transistors wherein a first current electrode of a third transistor is coupled to receive the first pre-decode signal, a second current electrode of the third transistor is coupled to a first current electrode of a fourth transistor and to an output of the second driver circuit, a second current electrode of the fourth transistor is coupled to the first supply terminal, and a control electrode of the third transistor and a control electrode of the fourth transistor are coupled to a third pre-decode signal. The decoder further includes a fifth transistor having a first current electrode coupled to the output of the first driver circuit, a second current electrode coupled to the output of the second driver circuit, and a control electrode coupled to a fourth pre-decode signal. The decoder circuit may further include a third driver circuit including a third plurality of series connected transistors wherein a first current electrode of a sixth transistor is coupled to receive a fifth pre-decode signal, a second current electrode of the sixth transistor is coupled to a first current electrode of a seventh transistor and to an output of the third driver circuit, a second current electrode of the seventh transistor is coupled to the first supply terminal, and a control electrode of the sixth transistor and a control electrode of the seventh transistor are coupled to the second pre-decode signal; a fourth driver circuit including a fourth plurality of series connected transistors wherein a first current electrode of an eighth transistor is coupled to receive the fifth pre-decode signal, a second current electrode of the eighth transistor is coupled to a first current electrode of a ninth transistor and to an output of the fourth driver circuit, a second current electrode of the ninth transistor is coupled to the first supply terminal, and a control electrode of the eighth transistor and a control electrode of the ninth transistor are coupled to the third pre-decode signal; and a tenth transistor having a first current electrode coupled to the output of the third driver circuit, a second current electrode coupled to the output of the fourth driver circuit, and a control electrode coupled to a sixth pre-decode signal. The decoder may have a further characterization by which the fourth pre-decode signal is a complement of the first pre-decode signal and the sixth pre-decode signal is a complement of the fifth pre-decode signal. The decoder may have a further characterization by which the decoder circuit is disabled when the second pre-decode signal and the third pre-decode signal are both asserted. The decoder may have a further characterization by which the decoder circuit is characterized as a one-hot decoder having only one output of the circuit driver outputs asserted at a time.

The decoder circuit may further include a fifth driver circuit including a fifth plurality of series connected transistors wherein a first current electrode of an eleventh transistor is coupled to receive the first pre-decode signal, a second current electrode of the eleventh transistor is coupled to a first current electrode of a twelfth transistor and to an output of the fifth driver circuit, a second current electrode of the twelfth transistor is coupled to the first supply terminal, and a control electrode of the eleventh transistor and a control electrode of the twelfth transistor are coupled to a seventh pre-decode signal; a sixth driver circuit including a sixth plurality of series connected transistors wherein a first current electrode of a thirteenth transistor is coupled to receive the first pre-decode signal, a second current electrode of the thirteenth transistor is coupled to a first current electrode of a fourteenth transistor and to an output of the sixth driver circuit, a second current electrode of the fourteenth transistor is coupled to the first supply terminal, and a control electrode of the thirteenth transistor and a control electrode of the fourteenth transistor are coupled to an eighth pre-decode signal; and a fifteenth transistor having a first current electrode coupled to the output of the fifth driver circuit, a second current electrode coupled to the output of the sixth driver circuit, and a control electrode coupled to the fourth pre-decode signal.

Disclosed also is a memory system having a controller unit to control access to a memory. The memory system further includes a predecoder unit coupled to the controller unit, the predecoder unit generating a plurality of pre-decode signals. The memory system further includes a memory array including bit-cells arranged in rows and columns. The memory system further includes a row decoder unit coupled between the predecoder unit and the memory array, the row decoder unit including a plurality of word line driver circuits, wherein each word line driver circuit of the plurality of word line driver circuits includes a first driver circuit including a first plurality of series connected transistors wherein a first current electrode of a first transistor is coupled to receive a first pre-decode signal, a second current electrode of the first transistor is coupled to a first current electrode of a second transistor and to an output of the first driver circuit, a second current electrode of the second transistor is coupled to a first supply terminal, and a control electrode of the first transistor and a control electrode of the second transistor are coupled to a second pre-decode signal, a second driver circuit including a second plurality of series connected transistors wherein a first current electrode of a third transistor is coupled to receive the first pre-decode signal, a second current electrode of the third transistor is coupled to a first current electrode of a fourth transistor and to an output of the second driver circuit, a second current electrode of the fourth transistor is coupled to the first supply terminal, and a control electrode of the third transistor and a control electrode of the fourth transistor are coupled to a third pre-decode signal, and a fifth transistor having a first current electrode coupled to the output of the first driver circuit, a second current electrode coupled to the output of the second driver circuit, and a control electrode coupled to a fourth pre-decode signal. The memory system may have a further characterization by which the output of the first driver circuit is coupled to drive a first word line in the memory array and the output of the second driver circuit is coupled to drive a second word line in the memory array, the first word line coupled to bit-cells in a first row and the second word line coupled to bit-cells in a second row. The memory system may have a further characterization by which each word line driver circuit of the plurality of word line driver circuits further includes a third driver circuit including a third plurality of series connected transistors wherein a first current electrode of a sixth transistor is coupled to receive a fifth pre-decode signal, a second current electrode of the sixth transistor is coupled to a first current electrode of a seventh transistor and to an output of the third driver circuit, a second current electrode of the seventh transistor is coupled to the first supply terminal, and a control electrode of the sixth transistor and a control electrode of the seventh transistor are coupled to the second pre-decode signal, a fourth driver circuit including a fourth plurality of series connected transistors wherein a first current electrode of an eighth transistor is coupled to receive the fifth pre-decode signal, a second current electrode of the eighth transistor is coupled to a first current electrode of a ninth transistor and to an output of the fourth driver circuit, a second current electrode of the ninth transistor is coupled to the first supply terminal, and a control electrode of the eighth transistor and a control electrode of the ninth transistor are coupled to the third pre-decode signal, and a tenth transistor having a first current electrode coupled to the output of the third driver circuit, a second current electrode coupled to the output of the fourth driver circuit, and a control electrode coupled to a sixth pre-decode signal.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. For example, it may be feasible to use an N channel transistor in place of P channel transistor 24 although there are advantages to using a P channel transistor. For example, pre-decode signal Y0 can be retained as is and not require a complement. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A decoder circuit comprising:
    a first driver circuit having an input coupled to receive a first pre-decode signal and an output, the first driver circuit including a stack of transistors wherein a first current electrode of a first transistor in the stack is coupled to receive a second pre-decode signal and a first current electrode of a second transistor in the stack is coupled to a first supply terminal;
    a second driver circuit having an input coupled to receive a third pre-decode signal and an output, the second driver circuit including a stack of transistors wherein a first current electrode of a third transistor in the stack is coupled to receive the second pre-decode signal and a first current electrode of a fourth transistor in the stack is coupled to the first supply terminal; and
    a fifth transistor having a first current electrode coupled to the output of the first driver circuit, a second current electrode coupled to the output of the second driver circuit, and a control electrode coupled to a fourth pre-decode signal.

2. The decoder circuit of claim 1, wherein the fourth pre-decode signal is a complement of the second pre-decode signal.

3. The decoder circuit of claim 1, wherein the third pre-decode signal is a complement of the first pre-decode signal.

4. The decoder circuit of claim 1, wherein the output of the first driver circuit is coupled to drive a first word line and the output of the second driver circuit is coupled to drive a second word line.

5. The decoder circuit of claim 1, wherein the decoder circuit is disabled when the first pre-decode signal and the third pre-decode signal are both asserted.

6. The decoder circuit of claim 1, wherein:
    a second current electrode of the first transistor is coupled to a second current electrode of the second transistor and to the output of the first driver circuit;
    a control electrode of the first transistor is coupled to a control electrode of the second transistor and to the input of the first driver circuit;
    a second current electrode of the third transistor is coupled to a second current electrode of the fourth transistor and to the output of the second driver circuit; and
    a control electrode of the third transistor is coupled to a control electrode of the fourth transistor and to the input of the second driver circuit.

7. The decoder circuit of claim 1, wherein the fifth transistor operatively couples a signal from the output of the first driver circuit to the output of the second driver circuit or from the output of the second driver circuit to the output of the first driver circuit.

8. The decoder circuit of claim 1, wherein the first transistor and the third transistor are characterized as P-channel transistors, and the second transistor and the fourth transistor are characterized as N-channel transistors.

9. The decoder circuit of claim 1, wherein the fifth transistor is characterized as an N-channel transistor.

10. The decoder circuit of claim 1, further comprising:
a first plurality of conductive paths to transfer the first and third pre-decode signals to the inputs of the first and second driver circuits, the first plurality arranged to run substantially parallel to the first and second word lines; and
a second plurality of conductive paths to transfer the second pre-decode signal to the first current electrodes of the first and third transistors and to transfer the fourth pre-decode signal to the control electrode of the fifth transistor, the second plurality arranged substantially orthogonal to the first plurality.

11. The decoder circuit of claim 1, further comprising:
a third driver circuit having an input coupled to receive the first pre-decode signal and an output, the third driver circuit including a stack of transistors wherein a first current electrode of a sixth transistor in the stack is coupled to receive a fifth pre-decode signal and a first current electrode of a seventh transistor in the stack is coupled to the first supply terminal;
a fourth driver circuit having an input coupled to receive the third pre-decode signal and an output, the fourth driver circuit including a stack of transistors wherein a first current electrode of a eighth transistor in the stack is coupled to receive the fifth pre-decode signal and a first current electrode of a ninth transistor in the stack is coupled to the first supply terminal; and
a tenth transistor having a first current electrode coupled to the output of the third driver circuit, a second current electrode coupled to the output of the fourth driver circuit, and a control electrode coupled to a sixth pre-decode signal.

12. A decoder circuit comprising:
a first driver circuit including a first plurality of series connected transistors wherein a first current electrode of a first transistor is coupled to receive a first pre-decode signal, a second current electrode of the first transistor is coupled to a first current electrode of a second transistor and to an output of the first driver circuit, a second current electrode of the second transistor is coupled to a first supply terminal, and a control electrode of the first transistor and a control electrode of the second transistor are coupled to a second pre-decode signal;
a second driver circuit including a second plurality of series connected transistors wherein a first current electrode of a third transistor is coupled to receive the first pre-decode signal, a second current electrode of the third transistor is coupled to a first current electrode of a fourth transistor and to an output of the second driver circuit, a second current electrode of the fourth transistor is coupled to the first supply terminal, and a control electrode of the third transistor and a control electrode of the fourth transistor are coupled to a third pre-decode signal; and
a fifth transistor having a first current electrode coupled to the output of the first driver circuit, a second current electrode coupled to the output of the second driver circuit, and a control electrode coupled to a fourth pre-decode signal.

13. The decoder circuit of claim 12, further comprising:
a third driver circuit including a third plurality of series connected transistors wherein a first current electrode of a sixth transistor is coupled to receive a fifth pre-decode signal, a second current electrode of the sixth transistor is coupled to a first current electrode of a seventh transistor and to an output of the third driver circuit, a second current electrode of the seventh transistor is coupled to the first supply terminal, and a control electrode of the sixth transistor and a control electrode of the seventh transistor are coupled to the second pre-decode signal;
a fourth driver circuit including a fourth plurality of series connected transistors wherein a first current electrode of an eighth transistor is coupled to receive the fifth pre-decode signal, a second current electrode of the eighth transistor is coupled to a first current electrode of a ninth transistor and to an output of the fourth driver circuit, a second current electrode of the ninth transistor is coupled to the first supply terminal, and a control electrode of the eighth transistor and a control electrode of the ninth transistor are coupled to the third pre-decode signal; and
a tenth transistor having a first current electrode coupled to the output of the third driver circuit, a second current electrode coupled to the output of the fourth driver circuit, and a control electrode coupled to a sixth pre-decode signal.

14. The decoder circuit of claim 13, wherein the fourth pre-decode signal is a complement of the first pre-decode signal and the sixth pre-decode signal is a complement of the fifth pre-decode signal.

15. The decoder circuit of claim 13, wherein the decoder circuit is disabled when the second pre-decode signal and the third pre-decode signal are both asserted.

16. The decoder circuit of claim 13, wherein the decoder circuit is characterized as a one-hot decoder having only one output of the circuit driver outputs asserted at a time.

17. The decoder circuit of claim 13, further comprising:
a fifth driver circuit including a fifth plurality of series connected transistors wherein a first current electrode of an eleventh transistor is coupled to receive the first pre-decode signal, a second current electrode of the eleventh transistor is coupled to a first current electrode of a twelfth transistor and to an output of the fifth driver circuit, a second current electrode of the twelfth transistor is coupled to the first supply terminal, and a control electrode of the eleventh transistor and a control electrode of the twelfth transistor are coupled to a seventh pre-decode signal;
a sixth driver circuit including a sixth plurality of series connected transistors wherein a first current electrode of a thirteenth transistor is coupled to receive the first pre-decode signal, a second current electrode of the thirteenth transistor is coupled to a first current electrode of a fourteenth transistor and to an output of the sixth driver circuit, a second current electrode of the fourteenth transistor is coupled to the first supply terminal, and a control electrode of the thirteenth transistor and a control electrode of the fourteenth transistor are coupled to an eighth pre-decode signal; and
a fifteenth transistor having a first current electrode coupled to the output of the fifth driver circuit, a second current electrode coupled to the output of the sixth driver circuit, and a control electrode coupled to the fourth pre-decode signal.

18. A memory system comprising:
a controller unit to control access to a memory;
a predecoder unit coupled to the controller unit, the predecoder unit generating a plurality of pre-decode signals;
a memory array including bit-cells arranged in rows and columns;
a row decoder unit coupled between the predecoder unit and the memory array, the row decoder unit including a plurality of word line driver circuits, wherein each word line driver circuit of the plurality of word line driver circuits comprises:
  a first driver circuit including a first plurality of series connected transistors wherein a first current electrode of a first transistor is coupled to receive a first pre-decode signal, a second current electrode of the first transistor is coupled to a first current electrode of a second transistor and to an output of the first driver circuit, a second current electrode of the second transistor is coupled to a first supply terminal, and a control electrode of the first transistor and a control electrode of the second transistor are coupled to a second pre-decode signal;
  a second driver circuit including a second plurality of series connected transistors wherein a first current electrode of a third transistor is coupled to receive the first pre-decode signal, a second current electrode of the third transistor is coupled to a first current electrode of a fourth transistor and to an output of the second driver circuit, a second current electrode of the fourth transistor is coupled to the first supply terminal, and a control electrode of the third transistor and a control electrode of the fourth transistor are coupled to a third pre-decode signal; and
  a fifth transistor having a first current electrode coupled to the output of the first driver circuit, a second current electrode coupled to the output of the second driver circuit, and a control electrode coupled to a fourth pre-decode signal.

19. The memory system of claim 18, wherein the output of the first driver circuit is coupled to drive a first word line in the memory array and the output of the second driver circuit is coupled to drive a second word line in the memory array, the first word line coupled to bit-cells in a first row and the second word line coupled to bit-cells in a second row.

20. The memory system of claim 18, wherein each word line driver circuit of the plurality of word line driver circuits further comprises:
  a third driver circuit including a third plurality of series connected transistors wherein a first current electrode of a sixth transistor is coupled to receive a fifth pre-decode signal, a second current electrode of the sixth transistor is coupled to a first current electrode of a seventh transistor and to an output of the third driver circuit, a second current electrode of the seventh transistor is coupled to the first supply terminal, and a control electrode of the sixth transistor and a control electrode of the seventh transistor are coupled to the second pre-decode signal;
  a fourth driver circuit including a fourth plurality of series connected transistors wherein a first current electrode of an eighth transistor is coupled to receive the fifth pre-decode signal, a second current electrode of the eighth transistor is coupled to a first current electrode of a ninth transistor and to an output of the fourth driver circuit, a second current electrode of the ninth transistor is coupled to the first supply terminal, and a control electrode of the eighth transistor and a control electrode of the ninth transistor are coupled to the third pre-decode signal; and
  a tenth transistor having a first current electrode coupled to the output of the third driver circuit, a second current electrode coupled to the output of the fourth driver circuit, and a control electrode coupled to a sixth pre-decode signal.

\* \* \* \* \*